(12) United States Patent
Horng et al.

(10) Patent No.: US 9,369,091 B2
(45) Date of Patent: Jun. 14, 2016

(54) DUAL FEEDBACK LOW NOISE AMPLIFIER

(71) Applicant: NATIONAL SUN YAT-SEN UNIVERSITY, Kaohsiung (TW)

(72) Inventors: Tzyy-Sheng Horng, Kaohsiung (TW); Rong-Fu Ye, Kaohsiung (TW); Jian-Ming Wu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/275,077

(22) Filed: May 12, 2014

(65) Prior Publication Data
US 2015/0214900 A1 Jul. 30, 2015

(30) Foreign Application Priority Data

Jan. 28, 2014 (TW) .............................. 103103307 A

(51) Int. Cl.
*H03F 3/45* (2006.01)
*H03F 1/26* (2006.01)
*H03F 1/56* (2006.01)
*H03F 3/193* (2006.01)

(52) U.S. Cl.
CPC .................. *H03F 1/26* (2013.01); *H03F 1/565* (2013.01); *H03F 3/193* (2013.01); *H03F 3/45179* (2013.01); *H03F 2200/117* (2013.01); *H03F 2200/129* (2013.01); *H03F 2200/222* (2013.01); *H03F 2200/267* (2013.01); *H03F 2200/294* (2013.01); *H03F 2200/372* (2013.01); *H03F 2203/45394* (2013.01); *H03F 2203/45544* (2013.01); *H03F 2203/45562* (2013.01); *H03F 2203/45621* (2013.01); *H03F 2203/45638* (2013.01); *H03F 2203/45702* (2013.01); *H03F 2203/45731* (2013.01)

(58) Field of Classification Search
CPC .................................... H03F 1/347; H03F 3/45
USPC ..................................... 330/79, 103, 104, 260
See application file for complete search history.

(56) References Cited

U.S. PATENT DOCUMENTS 3,043,965 A * 7/1962 Scarbrough et al. .......... 327/190
7,596,364 B2 9/2009 Sjoland

OTHER PUBLICATIONS

Rong-Fu Ye et al., Two CMOS Dual-Feedback Common-Gate Low-Noise Amplifiers With Wideband Input and Noise Matching, IEEE Transactions on Microwave Theory and Techniques, vol. 61, No. 10, Oct. 2013, Aug. 19, 2013, 3690-3699.
Rong-Fu Ye, Design of Wideband and Low-Power CMOS RFICs with Integrated Passive Devices, Doctorate Dissertation of National Sun Yat-sen University, Oct. 24, 2013.
Rong-Fu Ye et al., Wideband common-gate low-noise amplifier with dual-feedback for simultaneous input and noise matching, Proc. IEEE Radio Freq. Integr. Circuits Symp., pp. 1-4 2011.
Taiwanese Office Action mailed Nov. 5, 2015 for Taiwanese Patent Application No. 103103307, 5 pages.

* cited by examiner

*Primary Examiner* — Steven J Mottola
(74) *Attorney, Agent, or Firm* — Jackson IPG PLLC; Demian K. Jackson

(57) ABSTRACT

A dual feedback low noise amplifier includes a negative-feedback capacitive mutual-coupled common-gate amplifier of parallel-input parallel-output (PIPO) composed of a first transistor, a second transistor, a first coupling capacitor and a second coupling capacitor and a positive-feedback common-gate amplifier of parallel-input parallel-output (PIPO) composed of the first transistor, the second transistor, a first transformer and a second transformer. By means of dual feedback, the transconductance gain of the dual feedback low noise amplifier is increased, and the noise figure of the dual feedback low noise amplifier is decreased.

11 Claims, 2 Drawing Sheets

DUAL FEEDBACK LOW NOISE AMPLIFIER

FIELD OF THE INVENTION

The present invention is generally relating to an amplifier, more particularly to the dual feedback low noise amplifier.

BACKGROUND OF THE INVENTION

With reference to FIG. 2, a conventional amplifier 200 comprises a first transistor 210 and a second transistor 220, wherein a gate terminal 211 of the first transistor 210 receives a first bias voltage via a first bias resistor 230, a source terminal 212 of the first transistor 210 is grounded via a first inductor 240, a drain terminal 213 of the first transistor 210 receives a power source via a first loading resistor 250, a gate terminal 221 of the second transistor 220 receives a second bias voltage via a second bias resistor 260, a source terminal 222 of the second transistor 220 is grounded via a second inductor 270, and a drain terminal 223 of the second transistor 220 receives a power source via a second loading resistor 280. The amplifier 200 receives an input signal $v_s$ via the source terminal 212 of the first transistor 210 and the source terminal 222 of the second transistor 220 and outputs an amplifying signal $v_s$ via the drain terminal 213 of the first transistor 210 and the drain terminal 223 of the second transistor 220, wherein the noise figure of the amplifier 200 can be expressed as followed:

$$F = 1 + \frac{\gamma}{\alpha} + \frac{4R_S}{R_L},$$

wherein $\gamma$ is the channel heat noise coefficient, $\alpha$ is the ratio between the transconductance value of the first transistor 210 and the second transistor 220 and the conductivity of drain electrode under zero bias voltage, $R_s$ is the input matching impedance, $R_L$ is the first loading resistor 250 and the second loading resistor 280. Therefore, following with the description of mentioned equation, under the condition that the amplifier 200 satisfies input matching ($R_s$, $\gamma$ and $\alpha$ are fixed values), the amplifier 200 fails to lower the noise except raising the magnitude of the first loading transistor 250 and the second loading resistor 280.

SUMMARY

The primary object of the present invention is to make a dual feedback low noise amplifier possess functions of high gain, wide bandwidth and low noise via dual feedback structure therefore meeting the Spec requirement for wide bandwidth receiver. Besides, by introducing the structure of single-staged amplifier, the dual feedback low noise amplifier of the present invention possesses the characteristic of low power consumption.

A dual feedback low noise amplifier of the present invention includes a first transistor, a second transistor, a first coupling capacitor, a second coupling capacitor, a first transformer and a second transformer. One end of the first coupling capacitor connects to a second terminal of the first transistor, and the other end of the first coupling capacitor connects to a fourth terminal of the second transistor. One end of the second coupling capacitor connects to a first terminal of the first transistor, and the other end of the second coupling capacitor connects to a fifth terminal of the second transistor. The first transformer comprises a first secondary inductor and a first primary inductor, wherein one end of the first secondary inductor connects to a ground terminal, the other end of the first secondary inductor connects to the second terminal of the first transistor, one end of the first primary inductor connects to a voltage terminal, and the other end of the first primary inductor connects to a third terminal of the first transistor. The second transformer comprises a second secondary inductor and a second primary inductor, wherein one end of the second secondary inductor connects to the ground terminal, the other end of the second secondary inductor connects to the fifth terminal of the second transistor, one end of the second primary inductor connects to the voltage terminal, and the other end of the second primary inductor connects to a sixth terminal of the second transistor.

In the present invention, by the negative-feedback capacitive mutual-coupled common-gate amplifier of parallel-input parallel-output (PIPO) composed of the first transistor, the second transistor, the first coupling capacitor and the second coupling capacitor, in addition, by the positive-feedback common-gate amplifier of parallel-input parallel-output (PIPO) composed of the first transistor, the second transistor, the first transformer and the second transformer, the dual feedback low noise amplifier of the present invention achieves the functions of wide bandwidth, high linearity and low noise by means of dual feedback to meet the Spec requirement for wide bandwidth receiver. Additionally, comparing with a cascaded low noise amplifier, the low noise amplifier of the present invention is superior in low power consumption for the reason that the low noise amplifier is a single-staged amplifier.

DETAILED DESCRIPTION OF THE INVENTION

Figure 1:
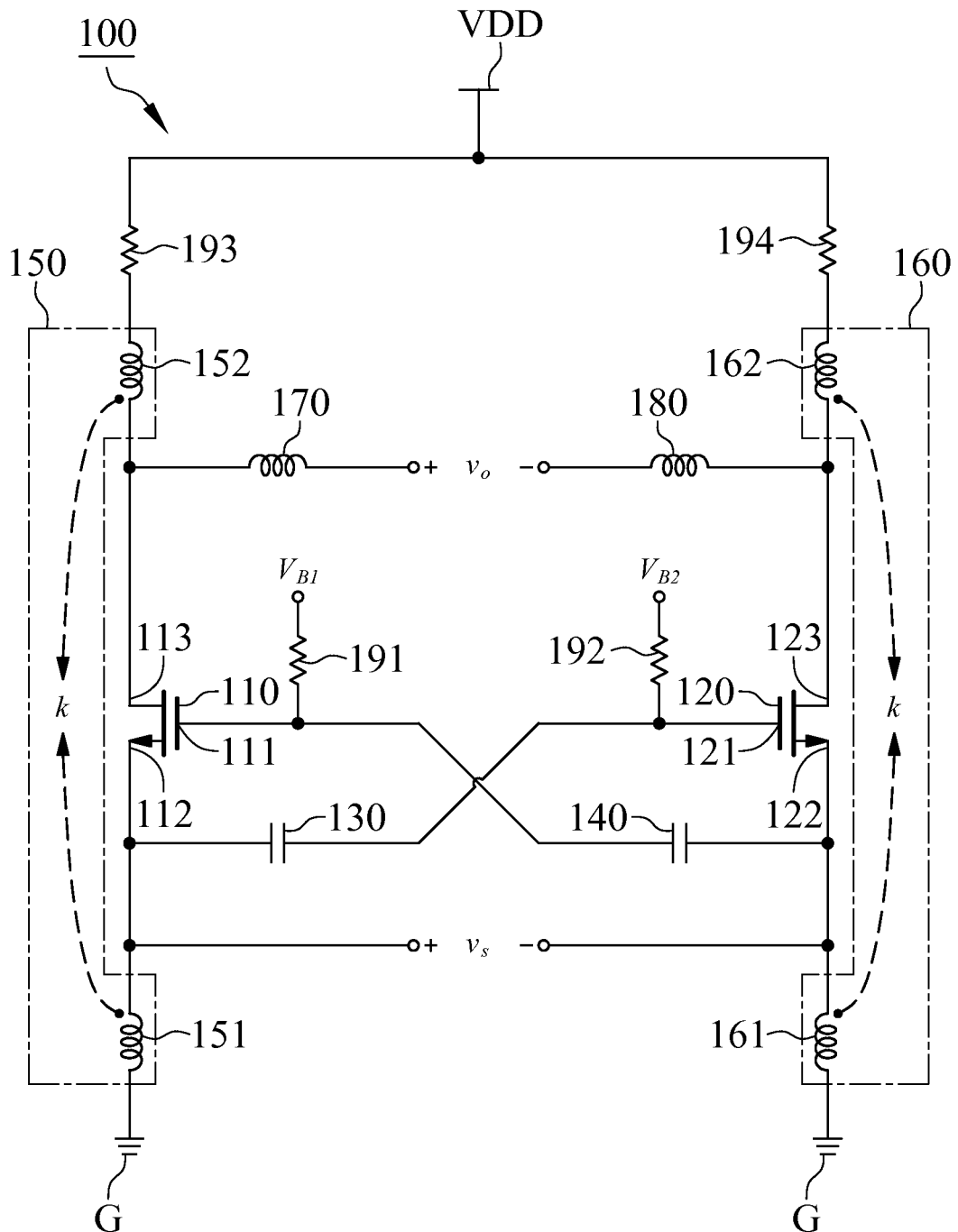
FIG. 1 is the circuit diagram illustrating a dual feedback low noise amplifier in accordance with an embodiment of the present invention.
Figure 2:
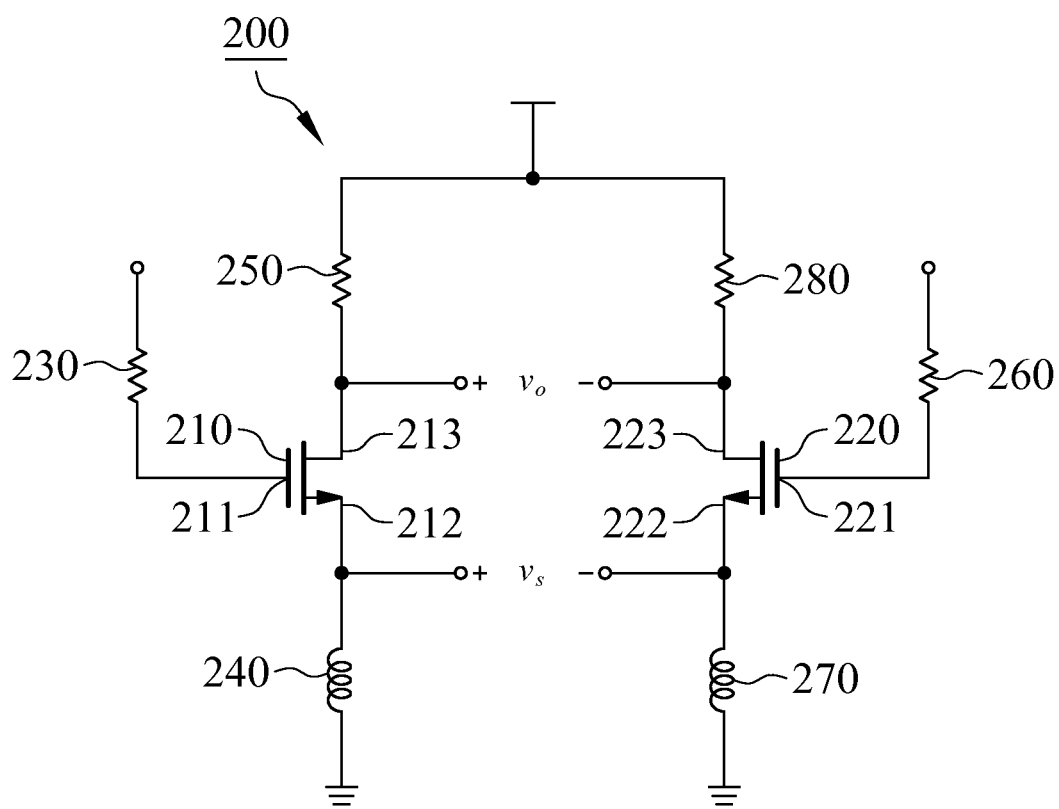
FIG. 2 is the circuit diagram illustrating a conventional amplifier.

With reference to FIG. 1, a dual feedback low noise amplifier 100 in accordance with an embodiment of the present invention includes a first transistor 110, a second transistor 120, a first coupling capacitor 130, a second coupling capacitor 140, a first transformer 150 and a second transformer 160, wherein a negative-feedback capacitive mutual-coupled common-gate amplifier of parallel-input parallel-output (PIPO) is composed of the first transistor 110, the second transistor 120, the first coupling capacitor 130 and the second coupling capacitor 140, and a positive-feedback common-gate amplifier of parallel-input parallel-output (PIPO) is composed of the first transistor 110, the second transistor 120, the first transformer 150 and the second transformer 160. By means of dual feedback, the equivalent transconductance of the dual feedback low noise amplifier 100 is increased, and the noise figure of the dual feedback low noise amplifier 100 is decreased.

Referring to FIG. 1, the first transistor 110 comprises a first terminal 111, a second terminal 112 and a third terminal 113, and the second transistor 120 comprises a fourth terminal 121, a fifth terminal 122 and a sixth terminal 123. In this embodiment, the first transistor 110 and the second transistor 120 are both MOSFET, wherein the first terminal 111 of the first transistor 110 is gate electrode, the second terminal 112 of the first transistor 110 is source electrode, the third terminal 113 of the first transistor 110 is drain electrode, the fourth terminal 121 of the second transistor 120 is gate electrode, the fifth terminal 122 of the second transistor 120 is source electrode, and the sixth terminal 123 of the second transistor 120 is drain electrode.

With reference to FIG. 1, one end of the first coupling capacitor 130 connects to the second terminal 112 of the first transistor 110, and the other end of the first coupling capacitor 130 connects to the fourth terminal 121 of the second transistor 120, one end of the second coupling capacitor 140 connects to the first terminal 111 of the first transistor 110, and the other end of the second coupling capacitor 140 connects to the fifth terminal 122 of the second transistor 120 so as to constitute the negative-feedback capacitive mutual-coupled common-gate amplifier of parallel-input parallel-output (PIPO) therefore effectively increasing the transconductance and lowering the noise figure.

With reference to FIG. 1, the first transformer 150 comprises a first secondary inductor 151 and a first primary inductor 152, wherein one end of the first secondary inductor 151 connects to a ground terminal G, the other end of the first secondary inductor 151 connects to the second terminal 112 of the first transistor 110, one end of the first primary inductor 152 connects to a voltage terminal VDD, and the other end of the first primary inductor 152 connects to the third terminal 113 of the first transistor 110. The second transformer 160 comprises a second secondary inductor 161 and a second primary inductor 162, wherein one end of the second secondary inductor 161 connects to the ground terminal G, the other end of the second secondary inductor 161 connects to the fifth terminal 122 of the second transistor 120, one end of the second primary inductor 162 connects to the voltage terminal VDD, and the other end of the second primary inductor 162 connects to the sixth terminal 123 of the second transistor 120 so as to constitute the positive-feedback common-gate amplifier of parallel-input parallel-output (PIPO). The current gain of the dual feedback low noise amplifier 100 is increased via the electro-magnetic coupling between the first secondary inductor 151 and the first primary inductor 152 and the electro-magnetic coupling between the second secondary inductor 161 and the second primary inductor 162. Besides, when the current gain increases, the first transformer 150 and the second transformer 160 do not generate the non-linear signals owing to the reason that the first transformer 150 and the second transformer 160 are linear devices. The first transformer 150 comprises a first electro-magnetic coupling coefficient and a first turns ratio, the second transformer 160 comprises a second electro-magnetic coupling coefficient and a second turns ratio, wherein the product between the first electro-magnetic coupling coefficient and the first turns ratio and the other product between the second electro-magnetic coupling coefficient and the second turns ratio are both smaller than 1 for maintaining the stability of the dual feedback low noise amplifier 100.

With reference to FIG. 1, the first terminal 111 of the first transistor 110 receives a first bias voltage $V_{B1}$ via a first bias resistor 191, and the third terminal 113 of the first transistor 110 connects to the voltage terminal VDD via the first primary inductor 152 and a first resistor 193 to bias the first transistor 110 into saturation region. The fourth terminal 121 of the second transistor 120 receives a second bias voltage $V_{B2}$ via a second bias resistor 192, and the sixth terminal 123 of the second transistor 120 connects to the voltage terminal VDD via the second primary inductor 162 and a second resistor 194 to bias the second transistor 120 into saturation region.

Referring to FIG. 1, in this embodiment, the dual feedback low noise amplifier 100 further includes a first peaking inductor 170 and a second peaking inductor 180, the first peaking inductor 170 connects to the third terminal 113 of the first transistor 110, and the second peaking inductor 180 connects to the sixth terminal 123 of the second transistor 120. The dual feedback low noise amplifier 100 receives an input signal $v_S$ via the second terminal 112 of the first transistor 110 and the fifth terminal 122 of the second transistor 120, wherein an output signal $v_o$ is outputted by the first peaking inductor 170 and the second peaking inductor 180, and a parallel/series peaking network is composed of the first peaking inductor 170 and the first primary inductor 152 of the first transformer 150, and the other parallel/series peaking network is composed of the second peaking inductor 180 and the second primary inductor 162 of the second transformer 160 therefore substantially increasing the gain bandwidth of the dual feedback low noise amplifier 100. Therefore, when the operational frequency of the dual feedback low noise amplifier 100 achieves 10 GHz, the noise figure of the dual feedback low noise amplifier 100 is maintained at 3 dB or lower than 3 dB.

By the negative-feedback capacitive mutual-coupled common-gate amplifier of parallel-input parallel-output (PIPO) composed of the first transistor 110, the second transistor 120, the first coupling capacitor 130 and the second coupling capacitor 140, also, by the positive-feedback common-gate amplifier of parallel-input parallel-output (PIPO) composed of the first transistor 110, the second transistor 120, the first transformer 150 and the second transformer 160, the dual feedback low noise amplifier 100 of the present invention achieves the functions of wide bandwidth, high linearity and low noise via the means of dual feedback to meet the Spec requirement for wide bandwidth receiver. Additionally, comparing with the cascaded low noise amplifier, the low noise amplifier 100 of the present invention is superior in low power consumption for the reason that the low noise amplifier 100 is a single-staged amplifier.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:
1. A dual feedback low noise amplifier includes:
a first transistor having a first terminal, a second terminal and a third terminal;
a second transistor having a fourth terminal, a fifth terminal and a sixth terminal;
a first coupling capacitor, wherein one end of the first coupling capacitor connects to the second terminal of the first transistor, and the other end of the first coupling capacitor connects to the fourth terminal of the second transistor;
a second coupling capacitor, wherein one end of the second coupling capacitor connects to the first terminal of the first transistor, and the other end of the second coupling capacitor connects to the fifth terminal of the second transistor;
a first transformer having a first secondary inductor and a first primary inductor, wherein one end of the first secondary inductor connects to a ground terminal, the other end of the first secondary inductor connects to the second terminal of the first transistor, one end of the first primary inductor connects to a voltage terminal, and the other end of the first primary inductor connects to the third terminal of the first transistor;

a second transformer having a second secondary primary inductor and a second primary inductor, wherein one end of the second secondary inductor connects to the ground terminal, the other end of the second secondary inductor connects to the fifth terminal of the second transistor, one end of the second primary inductor connects to the voltage terminal, and the other end of the second primary inductor connects to the sixth terminal of the second transistor, and, a first peaking inductor and a second peaking inductor, the first peaking inductor connects to the third terminal of the first transistor, the second peaking inductor connects to the sixth terminal of the second transistor, wherein a parallel/series peaking network is composed of the first peaking inductor and the first primary inductor, and the other parallel/series peaking network is composed of the second peaking inductor and the second primary inductor.

2. The dual feedback low noise amplifier in accordance with claim 1 further includes a first bias resistor and a second bias resistor, wherein one end of the first bias resistor receives a first bias voltage, the other end of the first bias resistor connects to the first terminal of the first transistor, one end of the second bias resistor receives a second bias voltage, the other end of the second bias resistor connects to the fourth terminal of the second transistor.

3. The dual feedback low noise amplifier in accordance with claim 1, wherein the first transformer comprises a first electro-magnetic coupling coefficient and a first turns ratio, and the product between the first electro-magnetic coupling coefficient and the first turns ratio is smaller than 1.

4. The dual feedback low noise amplifier in accordance with claim 1, wherein the second transformer comprises a second electro-magnetic coupling coefficient and a second turns ratio, and the product between the second electro-magnetic coupling coefficient and the second turns ratio is smaller than 1.

5. The dual feedback low noise amplifier in accordance with claim 3, wherein the second transformer comprises a second electro-magnetic coupling coefficient and a second turns ratio, and the product between the second electro-magnetic coupling coefficient and the second turns ratio is smaller than 1.

6. The dual feedback low noise amplifier in accordance with claim 1, wherein the first transistor is MOSFET, the first terminal of the first transistor is gate electrode, the second terminal of the first transistor is source electrode, and the third terminal of the first transistor is drain electrode.

7. The dual feedback low noise amplifier in accordance with claim 1, wherein the second transistor is MOSFET, the fourth terminal of the second transistor is gate electrode, the fifth terminal of the second transistor is source electrode, and the sixth terminal of the second transistor is drain electrode.

8. The dual feedback low noise amplifier in accordance with claim 6, wherein the second transistor is MOSFET, the fourth terminal of the second transistor is gate electrode, the fifth terminal of the second transistor is source electrode, and the sixth terminal of the second transistor is drain electrode.

9. The dual feedback low noise amplifier in accordance with claim 1, wherein an input signal is received by the dual feedback low noise amplifier via the second terminal of the first transistor and the fifth terminal of the second transistor.

10. The dual feedback low noise amplifier in accordance with claim 1, wherein the dual feedback low noise amplifier outputs an output signal via the first peaking inductor and the second peaking inductor.

11. A dual feedback low noise amplifier includes:
a first transistor having a first terminal, a second terminal and a third terminal;
a second transistor having a fourth terminal, a fifth terminal and a sixth terminal;
a first coupling capacitor, wherein one end of the first coupling capacitor is connected to the second terminal of the first transistor, and the other end of the first coupling capacitor is connected to the fourth terminal of the second transistor;
a second coupling capacitor, wherein one end of the second coupling capacitor is connected to the first terminal of the first transistor, and the other end of the second coupling capacitor is connected to the fifth terminal of the second transistor;
a first transformer having a first secondary inductor and a first primary inductor, wherein one end of the first secondary inductor is connected to a ground terminal, the other end of the first secondary inductor is connected to the second terminal of the first transistor, one end of the first primary inductor is connected to a voltage terminal, and the other end of the first primary inductor is connected to the third terminal of the first transistor;
a second transformer having a second secondary primary inductor and a second primary inductor, wherein one end of the second secondary inductor is connected to the ground terminal, the other end of the second secondary inductor connected to the fifth terminal of the second transistor, one end of the second primary inductor is connected to the voltage terminal, and the other end of the second primary inductor is connected to the sixth terminal of the second transistor, wherein the amplifier further includes a first resistor and a second resistor, wherein the first primary inductor is connected to the voltage terminal via the first resistor, the second primary inductor is connected to the voltage terminal via the second resistor; and
a first peaking inductor and a second peaking inductor, the first peaking inductor connects to the third terminal of the first transistor, the second peaking inductor connects to the sixth terminal of the second transistor, wherein a parallel/series peaking network is composed of the first peaking inductor and the first primary inductor, and the other parallel/series peaking network is composed of the second peaking inductor and the second primary inductor.

* * * * *